United States Patent
Kyoda et al.

(10) Patent No.: US 6,664,567 B2
(45) Date of Patent: Dec. 16, 2003

(54) PHOTOELECTRIC CONVERSION DEVICE, GLASS COMPOSITION FOR COATING SILICON, AND INSULATING COATING IN CONTACT WITH SILICON

(75) Inventors: Takeshi Kyoda, Yokaichi (JP); Jun Fukuda, Yokaichi (JP); Shinya Kawai, Kokubu (JP); Hisao Arimune, Yokaichi (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/186,321

(22) Filed: Jun. 26, 2002

(65) Prior Publication Data

US 2003/0047735 A1 Mar. 13, 2003

(30) Foreign Application Priority Data

Jun. 28, 2001 (JP) .......................... 2001-195878
Jul. 25, 2001 (JP) .......................... 2001-224634
Aug. 28, 2001 (JP) .......................... 2001-257608

(51) Int. Cl.[7] .................... H01L 31/0352; H01L 31/036
(52) U.S. Cl. .................... 257/53; 257/431; 257/449; 257/634; 136/250
(58) Field of Search .................... 257/53, 431, 449, 257/634; 136/250

(56) References Cited

U.S. PATENT DOCUMENTS 4,945,071 A * 7/1990 Friesen et al. ................ 501/41
6,437,234 B1 * 8/2002 Kyoda et al. ................ 136/250

FOREIGN PATENT DOCUMENTS

| JP | 61-124179 | 6/1986 |
| JP | 01-110776 | 7/1989 |
| JP | 04-207085 | 7/1992 |
| JP | 09-278482 | 10/1997 |

* cited by examiner

Primary Examiner—Jerome Jackson
(74) Attorney, Agent, or Firm—Hogan & Hartson

(57) ABSTRACT

A photoelectric conversion device is provided, which comprises: a substrate serving as an electrode; numerous crystalline semiconductor particles containing a first conductivity-type impurity deposited on the substrate to join thereto; an insulator provided among the crystalline semiconductor particles; and a semiconductor layer containing an impurity of the opposite conductivity-type to which another electrode is connected, which semiconductor layer being provided over the crystalline semiconductor particles, wherein the crystalline semiconductor particles comprise silicon, and the insulator comprises a glass material which contains at least 1 wt % and at most 20 wt % tin oxide. By this arrangement, it is possible to form a good insulator capable of filling spaces among the crystalline semiconductor particles and preventing defects such as cracking, bubbling and abnormal deposition from occurring, and consequently to provide a photoelectric conversion device with high reliability at low cost.

11 Claims, 2 Drawing Sheets

PHOTOELECTRIC CONVERSION DEVICE, GLASS COMPOSITION FOR COATING SILICON, AND INSULATING COATING IN CONTACT WITH SILICON

This application is based on applications Nos. 2001-195878, 2001-224634, and 2001-257608 filed in Japan, the content of which is incorporated hereinto by reference.

BACKGROUND OF THE INVENTION

1. Field of the Invention

The present invention relates to a photoelectric device using numerous crystalline semiconductor particles. This photoelectric conversion device is utilized suitably in solar cells.

The present invention also relates to a glass composition for coating silicon that is used for protecting a part of or the entire surface of silicon or for insulation between electrodes.

The present invention also relates to an insulating coating that is formed in a silicon semiconductor device and in contact with the silicon.

2. Description of the Related Art (A) Advent of a next-generation, low-cost solar cell that allows the amount of the raw material, silicon, to be small has been eagerly awaited.

Conventional photoelectric devices in which crystalline semiconductor particles are used are shown in FIGS. 4 to 6.

FIG. 4 illustrates a structure disclosed in Japanese Unexamined Patent Publication (Kokai) No. Showa 61-124179. There is disclosed a photoelectric conversion device in which a first aluminum foil 10 is formed with apertures into which silicon balls 2 each having a n-type surface layer 9 formed on the surface of a p-type ball are inserted. The portions of the n-type surface layers 9 that have penetrated the back surface of the first aluminum foil 10 are removed, and an oxide layer 3 is formed on the back surface of the first aluminum foil 10. Portions of the oxide layer 3 that cover the silicon balls are removed, and then a second aluminum foil 8 is formed so as to join to the silicon balls 2.

FIG. 5 illustrates a structure disclosed in Japanese Patent Publication No. 2641800. There is disclosed a photoelectric conversion device in which a low melting-point metal layer 11 such as a tin layer is formed on a substrate 1. Crystalline semiconductor particles 2 of first conductivity-type are deposited on the low melting-point metal layer 11, and an amorphous semiconductor layer 7 of second conductivity-type is formed on the crystalline semiconductor particles 2 with an insulating layer 3 interposed between the low melting-point metal layer 11 and the amorphous semiconductor layer 7.

FIG. 6 illustrates a structure disclosed in Japanese Examined Patent Publication No. H08-34177. There is disclosed a method in which a high melting-point metal layer 12, a low melting-point layer 11 and fine crystalline semiconductor grains 13 are successively deposited on a substrate 1, and the fine crystalline semiconductor grains 13 are melted, saturated, and gradually cooled so that the semiconductor is grown by liquid-phase epitaxial growth, thereby forming the fine crystalline semiconductor grains 13 into a polycrystalline thin film. Incidentally, in FIG. 6, the numeral 14 denotes a polycrystalline or amorphous semiconductor layer of the opposite conductivity type, and the numeral 6 denotes a transparent conductive film.

In the photoelectric conversion device shown in FIG. 4, however, since the first aluminum foil 10 is formed with apertures into which the silicon balls 2 are pressed and inserted so as to join the n-type layers 9 of the silicon balls 2 and the aluminum foil together, the silicon balls 2 are required to have a uniform diameter. The manufacturing cost is therefore high. Also, since the temperature used for joining is lower than 577° C., which is the eutectic temperature of aluminum and silicon, the joining tends to be unstable.

In the photoelectric conversion device shown in FIG. 5, since the insulator 3 is formed after the crystalline semiconductor particles have been fixed on the low melting-point metal layer 11, the insulator 3 is formed not only on the low melting-point metal layer 11 but also on the crystalline semiconductor particles 2. Therefore, the insulator 3 on the crystalline semiconductor particles 2 needs to be removed before the amorphous semiconductor layer 7 is formed, which causes the number of processes to increase. Since the thickness of the amorphous semiconductor layer 7 needs to be small taking the great light absorption thereof into account. When the thickness of the amorphous semiconductor layer 7 is small, the tolerance to defects also becomes small necessitating stricter management of the cleaning process and the production environment. As a result, the manufacturing cost is high.

In the photoelectric conversion device shown in FIG. 6, since the low melting-point metal layer 11 is mixed into the first conductivity-type liquid-phase epitaxial polycrystalline layer 13, the performance of the solar cell is degraded. And due to the absence of insulator, current leakage occurs between the upper electrode 6 and the lower electrode 12.

In addition, it has been known that when conventional glass compositions are employed for the insulator in conventional photoelectric conversion devices, bubbling occurs due to its reaction to the crystalline semiconductor particles, and microcracks are generated during reliability tests.

It is a primary object of the present invention to provide a photoelectric conversion device with high conversion efficiency that can be manufactured at low cost.

(B) In today's age of intense information, information and communications technologies have rapidly been developing. Along with this trend, the demand for silicon semiconductor devices for use in MPUs and memories has been sharply on the rise. In addition, with the increasing consciousness for the environment, applications of silicon semiconductor devices other than information and communications equipment, such as solar cells, have been increasing fast.

In order to prevent errors and secure long-time reliability, the silicon is covered with an insulating coating in such semiconductor devices. By covering the silicon with an insulating coating, the silicon is protected from water and dust and insulation is provided between the electrodes.

For insulating coatings used for protecting silicon in optical semiconductor devices such as optical sensors and solar cells or insulating coatings for insulation between the electrodes in such optical semiconductor devices, transparency is required in addition to the insulation property and sealing property.

For the purpose of silicon protection, organic resin is employed for protection and sealing in applications in which the demand for reliability is relatively low. In applications for which high reliability is required, the insulating coating needs to be formed by using glass.

Generally, the insulating coatings made from glass are formed by covering silicon with glass paste, which is obtained by mixing particulate glass, organic binder, and solvent together, by a known printing method, a dispensing process, dipping or spin-coating, and thereafter performing a heat treatment to soften and fluidize the glass. The glass which has been conventionally used for forming insulating coatings to cover silicon is low softening-point glass composed mainly of PbO so that influence on the semiconductor device by heat is minimized.

However, since the PbO content needs to be large in order to lower the softening point and glass transition point, PbO-based low softening-point glass has a thermal expansion coefficient as high as $80 \times 10^{-7}/°$ C. at temperatures 40 to 400° C. When PbO-based low softening-point glass with such a high thermal expansion coefficient is employed for protection and insulation in silicon semiconductor devices with thermal expansion coefficients as low as $30 \times 10^{-7}/°$ C. to $45 \times 10^{-7}/°$ C., especially in large scale silicon semiconductor devices or solar cells with greater areas, due to thermal stress accompanying the ON/OFF switching of the semiconductor device and changes in the environment of use, cracks are generated in the glass and silicon and peeling occurs at the interfaces.

In order to lower the thermal expansion coefficient of the PbO-based low softening-point glass, adding a filler with a low thermal expansion coefficient is a general practice. However, this measure causes the insulating coating to have turbidity and loose transparency.

On the other hand, when the PbO content is reduced, although the thermal expansion coefficient is lowered by which the inconvenience due to the thermal stress mentioned above can be avoided, the softening point and glass transition point rise in most cases. This increases damage by heat to the silicon semiconductor devices.

In addition, using PbO is very unfavorable considering the adverse effects on the environment. The trend toward Pb-free manufacturing is accelerating in all industry fields. Likewise, the demand for Pb-free insulating coatings for silicon is sharply on the rise.

As discussed so far, there has been a surge in demand for lead-free glass powder with a low glass transition point and a low thermal expansion coefficient. One example of such glass is the glass disclosed in Japanese Unexamined Patent Publication No. H09-278482, which is composed mainly of $B_2O_3$—ZnO.

However, when an insulating coating is formed by using the $B_2O_3$—ZnO-based glass disclosed in the Japanese Unexamined Patent Publication No. H09-278482 above, the following problems arise: the silicon and glass react to each other making the use of the silicon semiconductor device impossible; the resultant insulating coating fails to obtain adequate sealing property because of great defects accompanying generation of bubbles; the insulating coating fails to obtain transparency.

Furthermore, due to crystallization of the $B_2O_3$—ZnO-based glass during the heat treatment, the insulating coating cannot be formed with transparency.

The present inventors discovered that, by lowering the thermal expansion coefficient and glass transition point of $B_2O_3$—ZnO-based glass, and by adding $SiO_2$ thereto, it is possible to suppress the reaction between glass and silicon, prevent generation of bubbles, and prevent crystallization at the same time. The present invention has been thus accomplished.

It is an object of the present invention to provide a glass composition for coating silicon that is capable of forming a transparent insulating coating with long time reliability, which has a low glass transition point and a low thermal expansion coefficient, and does not contain lead nor react to silicon, and is not crystallized at the desired temperature range.

It is another object of this invention to provide a transparent insulating coating in contact with silicon with a low glass transition point and a low thermal expansion coefficient, which does not contain lead and not react to silicon and is not crystallized at the desired temperature range, and has long time reliability.

BRIEF SUMMARY OF THE INVENTION (A) A photoelectric conversion device according to the present invention comprises: a substrate serving as an electrode; numerous crystalline semiconductor particles containing a first conductivity-type impurity deposited on the substrate to join thereto; an insulator provided among the crystalline semiconductor particles; and a semiconductor layer containing an impurity of the opposite conductivity-type to which another electrode is connected, which semiconductor layer being provided over the crystalline semiconductor particles, wherein the crystalline semiconductor particles comprise silicon, and the insulator comprises a glass material which contains at least 1 wt % and at most 20 wt % tin oxide.

A photoelectric conversion device according to the present invention comprises: a substrate serving as an electrode; numerous crystalline semiconductor particles containing a first conductivity-type impurity deposited on the substrate to join thereto; an insulator provided among the crystalline semiconductor particles; and a semiconductor layer containing an impurity of the opposite conductivity-type to which another electrode is connected, which semiconductor layer being provided over the crystalline semiconductor particles, wherein the crystalline semiconductor particles comprise silicon, and the insulator comprises a glass composition which contains 4.2 to 20 wt % tin oxide.

According to these photoelectric conversion devices, the insulator comprising the glass material that contains the above-stated amount of tin oxide fills spaces among the crystalline semiconductor particles and covers the whole exposed surface of the substrate without causing defects.

Accordingly, occurrence of cracking in the insulator and crystalline semiconductor particles is prevented, and defects such as bubbling and abnormal deposition can be prevented.

This allows crystalline semiconductor particles to be produced with lower grain size precision, the resultant photoelectric conversion device therefore yields a larger manufacturing margin permitting manufacturing thereof at lower manufacturing cost as compared with conventional photoelectric conversion devices.

Moreover, the presence of the insulator ensures separation of the positive electrode from the negative electrode. By employing a glass material containing tin oxide for the insulator, the molten glass and the silicon of the crystalline semiconductor particles are prevented from excessively reacting to each other. Low cost manufacturing is therefore realized.

Accordingly, it is possible to form a good insulator with stable reliability and provide a photoelectric conversion device with high reliability.

(B) A glass composition for coating silicon according to the present invention is substantially free of PbO, and contains $B_2O_3$, ZnO, and $SnO_2$, and has a thermal expansion coefficient of $80 \times 10^{-7}/°$ C. or less at temperatures from 40 to 400° C. and a glass transition point of 550° C. or below.

An insulating coating in contact with silicon according to the present invention comprises a glass composition which is substantially free of PbO, and contains $B_2O_3$, ZnO, and $SnO_2$, and has a thermal expansion coefficient of $80 \times 10^{-7}/°$ C. or less at temperatures from 40 to 400° C. and a glass transition point of 550° C. or below.

A method of forming an insulating coating according to the present invention comprises the steps of: covering a surface of silicon with a glass powder which is substantially free of PbO, and contains $B_2O_3$, ZnO, and $SnO_2$, and has a thermal expansion coefficient of $80 \times 10^{-7}/°$ C. or less at temperatures from 40 to 400° C. and a glass transition point of 550° C. or below; and performing a heat treatment at a temperature of 600° C. or below to soften and fluidize the glass powder, whereby forming an insulating coating on the silicon.

A photoelectric conversion device according to the present invention comprises silicon therein which is partly or wholly coated with an insulating coating comprising a glass composition which is substantially free of PbO, and contains $B_2O_3$, ZnO, and $SnO_2$, and has a thermal, expansion coefficient of $80 \times 10^{-7}/°$ C. or less at temperatures of 40 to 400° C. and a glass transition point of 550° C. or below.

Since the insulating coatings applied on the surface of the silicon described above have a low glass transition points and low thermal expansion coefficients, and do not react to the silicon, they cause little bubbling and are not crystallized at the desired temperature range. Accordingly, they have transparency as well as long time reliability.

The structural details for achieving the objects of this invention are now described referring to the appended drawings.

DETAILED DESCRIPTION OF THE INVENTION

<First Embodiment (photoelectric conversion device)>

Figure 1:
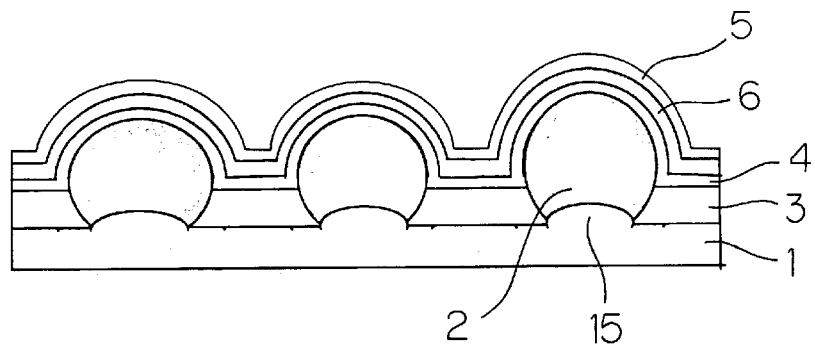
FIG. 1 is a cross-sectional view showing a photoelectric conversion device according to the present invention.
Figure 2:
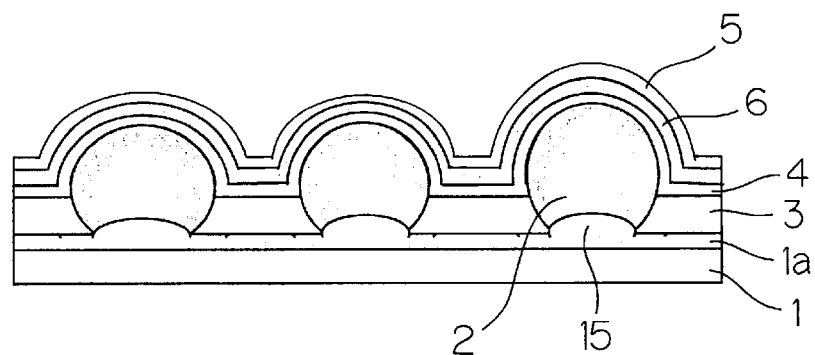
FIG. 2 is a cross-sectional view of a photoelectric conversion device according to the present invention in which the substrate has a two-layer structure.

FIGS. 1 and 2 are cross-sectional views of photoelectric conversion devices according to the present invention.

FIG. 1 shows a substrate (an electrode layer) 1, crystalline semiconductor particle 2, an insulator 3 comprising a glass material, a semiconductor layer 4, a protective layer 5, a conductive layer (another electrode layer) 6, and alloy layers 15 comprising the substrate 1 and the crystalline semiconductor particles 2.

The substrate 1 is composed of metal with a melting point higher than that of aluminum or ceramics. For example, aluminum, an aluminum alloy, iron, an iron alloy such as invar or covar, stainless steel, nickel, alumina or the like is used.

The substrate 1 may have a two-layer structure consisting of a layer made of a material other than aluminum and an electrode layer 1a made of aluminum as illustrated in FIG. 2. It is also possible to add one or a plural kinds of elements selected from among silicon, magnesium, manganese, chromium, titanium, nickel, zinc, silver, and copper to the electrode layer 1a made of aluminum so that it is kept prevented from excessive melting at the time of joining the crystalline semiconductor particles 2 thereto. The thickness of the electrode layer 1a is 20 μm or more. When the thickness is less than 20 μm, due to the shortage of thickness, the electrode layer 1a fails to have sufficient electrical connection with the crystalline semiconductor particles 2 when joined thereto.

Numerous first conductivity-type crystalline semiconductor particles 2 are deposited on the substrate 1 or the electrode layer 1a. The crystalline semiconductor particles 2 comprise Si or Ge, and small amount of p-type impurity such as B, Al, and Ga, or n-type impurity such as P and As added thereto.

The shapes of the semiconductor particles 3 may be polygons, curved surfaces or the like. The particle sizes may be even or uneven. However, uneven particle sizes will be advantageous to make the device more economical, because an additional process is necessary in order to uniformize the particle sizes. Also, having convex surfaces reduces the dependence on the incident angle of light.

Preferably, the particle sizes are in the range of 0.2 to 0.8 mm. Using crystalline semiconductor particles with particle sizes exceeding 0.8 mm makes no difference in the amount of the semiconductor material to be used from the amount used in conventional crystal plate type photoelectric conversion devices, which nullifies the material-saving advantage of using crystalline semiconductor particles. In addition, crystalline semiconductor particles with diameters less than 0.2 mm are difficult to be deposited on the substrate 1, which is another problem. More desirably, the particle sizes are in the range of 0.2 to 0.6 mm, considering the amount of silicon to be used.

A method for depositing numerous crystalline semiconductor particles 2 on the substrate 1 or the electrode layer 1a is as follows: a joining-aide layer that functions to bond and fix the crystalline semiconductor particles 2 to the surface of the substrate 1 is formed on the substrate 1, and the crystalline semiconductor particles 2 are deposited thereon, and then extra crystalline semiconductor particles 2 are dropped. This makes it possible to deposit the crystalline semiconductor particles 2 stably and densely on the surface of the substrate 1, irrespective of the particle size.

Subsequently, with a certain amount of load applied to the crystalline semiconductor particles 2, they are heated at a temperature higher than 577° C., which is the eutectic temperature of aluminum in the substrate 1 or electrode layer 1a and silicon in the crystalline semiconductor particles 2. Through this process, the substrate 1 and the crystalline semiconductor particles 2 can be joined together with the alloy layer 15 comprising the substrate 1 and the crystalline semiconductor particles 2 in between, while the joining-aide layer is removed by the heat. At this stage, all of the aluminum contained in the substrate 1 or the electrode layer 1a is contained in the alloy layer 15.

Incidentally, in the first conductivity type regions that are in contact with the alloy layers 15, aluminum, which is the material of the substrate 1, is dispersed and forms p+ layers within the crystalline semiconductor particles 2.

If formation of conductive diffusion regions p+ is simply intended for, heating at a temperature below the eutectic temperature of Al and Si i.e. 577° C. will serve the purpose. However, in such a case, the joining between the substrate 1 and the crystalline semiconductor particles 2 is so weak that the crystalline semiconductor particles leave the substrate, failing to maintain the structure as a solar cell.

The material for the joining-aide layer may be one that disappears at temperatures above 300° C. and below the temperature at which the substrate 1 and crystalline semiconductor particles 2 are joined. In cases where the process is performed in an oxidizing atmosphere, organic resin such as butyral resin, methylcellulose, ethylcellulose, polyvinyl alcohol(PVA), or polyethylene glycol (PEG) being dissolved in a solvent may be used. The process for forming the joining-aide layer may be a screen printing method, the doctor blade method, spraying, dipping or the like, by which the joining-aide layer is formed on the surface of the substrate 1 with a thickness of 10 to 100 $\mu$m.

The insulator 3 is provided for separating the positive electrode from the negative electrode and comprises an insulating material. The material may be, for example, a single glass material for low-temperature firing composed of components arbitrarily selected from among $SiO_2$, $B_2O_3$, $Al_2O_3$, CaO, MgO, $P_2O_5$, $Li_2O$, SnO, ZnO, Bao, $TiO_2$ and the like, or a glass material mixture in which a single glass material for low-temperature firing and a filler composed of one or a plurality of the above listed materials are combined together.

Powder of the glass material above is formed into paste by using a solvent or binder and applied over the crystalline semiconductor particles 2 deposited on the substrate 1, and then it is heated at a temperature below the eutectic temperature of aluminum and silicon, 577° C., by which the glass material is melted to form the insulator 3.

When the heating temperature exceeds 577° C., the alloy layers 15 comprising aluminum and silicon start melting causing the joining between the substrate 1 and crystalline semiconductor particles 2 to become unstable. In some cases, due to the crystalline semiconductor particles 2 leaving the substrate 1, it is impossible to generate a photoelectric current.

When a glass material is melted so as to form the insulator 3, if excessive reaction occurs between the glass material and the silicon of the crystalline semiconductor particles 2, a bubbling phenomenon occurs, creating defects in the insulator, which leads to the problem of current leakage.

In order to suppress the reaction between the melted glass material and silicon in the crystalline semiconductor particles 2, tin oxide is added to the glass material. The amount of the addition may be at least 1 wt % and at most 20 w %. When it is less than 1 wt %, bubbling cannot be suppressed, and when it is more than 20 wt %, the softening point of the glass is raised and the glass does not melt at 577° C., failing to fill spaces among the crystalline semiconductor particles.

A material having a thermal expansion coefficient of $30\times10^{-7}/°$ C. to $65\times10^{-7}/°$ C. at temperatures of 30 to 300° C. is used as the glass material. Thermal expansion coefficients less than $30\times10^{-7}/°$ C. are so different from the thermal expansion coefficient of the substrate 1, which is the thermal expansion coefficient of aluminum, $240\times10^{-7}/°$ C. that cracking occurs on the surface of the insulator 3 after the formation thereof. Thermal expansion coefficients more than $65\times10^{-7}/°$ C. are so different from that of the crystalline semiconductor particles 2, which is, for instance, the thermal expansion coefficient of Si: $26\times10^{-7}/°$ C., that cracking occurs in the crystalline semiconductor particles 2 and the insulator 3 around them.

Also, it is necessary that the softening point of the glass material is in a specific range so that the glass material is not melted or decomposed at the temperature for forming the semiconductor layer. With a softening point above 560° C., the glass material does not melt at temperatures near 577° C., which are the temperatures for joining the substrate 1 and crystalline semiconductor particles 2, failing to fill the spaces among the crystalline semiconductor particles 2. In such a case, the glass material cannot function as an insulator. Accordingly, the range of the softening point is, taking the temperature for forming an amorphous semiconductor layer into consideration, 200 to 560° C. Preferably, the range is 350 to 560° C., when the temperature for forming a semiconductor layer comprising a mixture of amorphous and crystalline semiconductors is taken into consideration.

After the insulator is formed, the surfaces of the crystalline semiconductor particles 2 are cleaned with cleaning liquid containing hydrofluoric acid. At this stage, if the insulator 3 contains a lead compound, the lead component is reduced into metal lead to be deposited on the surface of the insulator 3, causing current leakage. It is therefore favorable to use a glass material not containing lead oxide.

Meanwhile, although the description above refers to a method in which the insulator 3 is formed after the crystalline semiconductor particles 2 have been joined to the substrate 1, there is another method in which the insulator 3 is applied over numerous crystalline semiconductor particles 2 that have been deposited on the substrate 1, and then they are heated altogether so as to join the crystalline semiconductor particles 2 to the substrate 1 and form the insulator 3 at the same time.

The semiconductor layer 4 comprises, for example, Si. The semiconductor layer 4 is formed by a vapor-phase growth method or the like in which, for example, a phosphorous compound that is a n-type impurity or a boric compound that is a p-type impurity is added in small amount to a silane compound. The semiconductor layer may be of crystalline, amorphous, or mixture of crystalline and amorphous. When the light transmittance is taken into consideration, it is preferable that the layer comprises a crystalline semiconductor or a mixture of crystalline and amorphous semiconductors.

Apart of incident light penetrates the semiconductor layer 4 at areas where the crystalline semiconductor particles 2 are not present, and is reflected by the substrate 1 and directed to the crystalline semiconductor particles 2. This enables energy of light incident on the whole photoelectric conversion device to be efficiently transmitted to the crystalline semiconductor particles 2.

The conductivity of the semiconductor layer 4 may be, for example, on the order of $1\times10^{16}$ to $1\times10^{21}$ $atm/cm^3$.

In addition, the semiconductor layer 4 preferably be formed along the contours of the convex surfaces of the crystalline semiconductor particles 2. By forming the semiconductor layer 4 along the convex surfaces of the crystalline semiconductor particles 2, large areas can be provided for p-n junctions. Accordingly, carriers generated inside the crystalline semiconductor particles 2 can be efficiently collected.

Meanwhile, when the crystalline semiconductor particles 2 to be used are arranged such that each particle has a surface layer containing small amount of n-type impurity such as P or As, or p-type impurity such as B, Al, or Ga, the semiconductor layer 4 may be spared, and the conductive layer 6 is formed directly over the crystalline semiconductor particles 2.

On the semiconductor layer 4, the conductive layer 6 (another electrode) is formed. The conductive layer 6 is formed by a film-forming method such as the sputtering method or the vapor-phase growth method, or a coating and heating process. The conductive layer 6 is an oxide-based film composed of one or a plurality of compounds selected from among $SnO_2$, $In_2O_3$, ITO, ZnO, $TiO_2$ and the like, or a metal-based film composed of one or a plurality of metals selected from among Ti, Pt, Au and the like. In addition, the conductive layer 6 needs to be transparent so that a part of incident light penetrates the conductive layer 6 at areas where the crystalline semiconductor particles 2 are not present, and is reflected by the substrate 1 and directed to the crystalline semiconductor particles 2. This enables energy of light incident on the whole photoelectric conversion device to be efficiently transmitted to the crystalline semiconductor particles 2. A transparent conductive layer can have the effect of an antireflective film if the thickness is selected for that purpose. In addition, the conductive layer 6 is formed along the surface of the semiconductor layer 4 or along the surfaces of the crystalline semiconductor particles 2. Preferably it is formed along the convex contours of the crystalline semiconductor particles 2. By forming the semiconductor layer 4 along the convex surfaces of the crystalline semiconductor particles 2, large areas can be provided for p-n junctions. Accordingly, carriers generated inside the crystalline semiconductor particles 2 can be efficiently collected.

A protective layer 5 may be formed on the semiconductor layer 4 or on the conductive layer 6.

It is preferable for the protective layer 5 to have the properties of a transparent dielectric. It is formed by the CVD method, the PVD method or the like, in which, for example, one or a plurality of materials selected from among silicon oxide, cesium oxide, aluminum oxide, silicon nitride, titanium oxide, $SiO_2$—$TiO_2$, tantalum oxide, yttrium oxide are used to form a single layer or a combined layer on the semiconductor layer 4 or on the conductive layer 6. The protective layer 5 needs to be a transparent dielectric, because transparency is necessary for the layer being in contact with the surface where light is incident, and in order to prevent current leakage from occurring between the outside and the semiconductor layer 4 or the conductive layer 6, it needs to be a dielectric. It is possible to provide the protective layer 5 with the function of an antireflective film by optimizing the thickness of the layer for that purpose.

Moreover, it is also possible to provide a patterned electrode comprising fingers and bus bars at regular intervals on the semiconductor layer 4 or on the conductive layer 6 so as to connect the patterned electrode directly or indirectly to the semiconductor layer 4, thereby lowering the series resistance and consequently improving the conversion efficiency.

EXAMPLE

A substrate formed by attaching a 50 μm thick aluminum alloy onto a stainless steel by cold pressing process was used. For forming a joining-aide layer, a butyral resin was dissolved in an organic solvent and applied by screen printing or the doctor blade method on the substrate.

On top of them, p-type silicon particles with particle sizes of 0.2 to 0.6 mm were supplied several times so that the p-type silicon particles adhered firmly enough to the joining-aide layer. Then, the substrate was tilted to remove extra portion of the p-type silicon particles. Thereafter, with the p-type silicon particles being pressed by a certain amount of load and kept still, they were heated in the atmospheric air at a temperature above the eutectic temperature of aluminum and silicon, 577° C., for 5 to 30 minutes, thereby joining the silicon particles to the aluminum alloy. In order to form an insulator over the silicon particles, glass particles for low-temperature firing prepared in the form of paste shown in Table 1, which were composed of $SiO_2$, $B_2O_3$, $Al_2O_3$, $Li_2O$, $SnO_2$, ZnO and had average diameters of 0.5 to 5 μm were applied over the silicon particles so that the thickness after firing was about half the particle size of the silicon particles 2. Then, a heat treatment was carried out at a temperature above the eutectic temperature 577° C. of aluminum and silicon for 5 to 30 minutes, thereby forming the insulator 3.

Through the above-mentioned process, fourteen kinds of samples were fabricated by varying the components and contents thereof of the insulator 3 (Examples 1 to 7, Comparative examples 1 to 7). The number of each sample was five.

In example 1 to 7, the content of tin oxide in the glass was at least 1 wt %, and at most 20 wt %.

TABLE 1

|  | Silicon particle size (mm) | Glass composition | $SnO_2$ content (wt %) | PbO content (wt %) | Thermal expansion coefficient (E-7)/° C. | Softening point (° C.) |
| --- | --- | --- | --- | --- | --- | --- |
| E1 | 0.3 | $SiO_2$, $B_2O_3$, ZnO $Al_2O_3$, $Li_2O$, $SnO_2$ | 20 | 0 | 58 | 560 |
| E2 | 0.3 | $SiO_2$, $B_2O_3$, ZnO $Al_2O_3$, $Li_2O$, $SnO_2$ | 12 | 0 | 56 | 552 |
| E3 | 0.3 | $SiO_2$, $B_2O_3$, ZnO $Al_2O_3$, $Li_2O$, $SnO_2$ | 5 | 0 | 55 | 540 |
| E4 | 0.3 | $SiO_2$, $B_2O_3$, ZnO $Al_2O_3$, $Li_2O$, $SnO_2$ | 1 | 0 | 50 | 545 |
| E5 | 0.3 | $SiO_2$, $B_2O_3$, ZnO $Al_2O_3$, $Li_2O$, $SnO_2$ | 5 | 0 | 63 | 538 |
| E6 | 0.2 | $SiO_2$, $B_2O_3$, ZnO $Al_2O_3$, $Li_2O$, $SnO_2$ | 5 | 0 | 55 | 540 |
| E7 | 0.6 | $SiO_2$, $B_2O_3$, ZnO $Al_2O_3$, $Li_2O$, $SnO_2$ | 5 | 0 | 55 | 540 |
| C1* | 0.3 | $SiO_2$, $B_2O_3$, ZnO $Al_2O_3$, $Li_2O$, $SnO_2$ | 22 | 0 | 60 | 567 |

TABLE 1-continued

| | Silicon particle size (mm) | Glass composition | SnO$_2$ content (wt %) | PbO content (wt %) | Thermal expansion coefficient (E-7)/° C. | Softening point (° C.) |
|---|---|---|---|---|---|---|
| C2* | 0.3 | SiO$_2$, B$_2$O$_3$, ZnO Al$_2$O$_3$, Li$_2$O, SnO$_2$ | 0 | 0 | 51 | 545 |
| C3* | 0.3 | SiO$_2$, B$_2$O$_3$, ZnO Al$_2$O$_3$, Li$_2$O, SnO$_2$ | 0.5 | 0 | 51 | 545 |
| C4* | 0.3 | SiO$_2$, B$_2$O$_3$, ZnO Al$_2$O$_3$, Li$_2$O, SnO$_2$ | 5 | 0 | 68 | 537 |
| C5* | 0.3 | SiO$_2$, B$_2$O$_3$, ZnO Al$_2$O$_3$, Li$_2$O, SnO$_2$ | 5 | 0 | 45 | 570 |
| C6* | 0.3 | SiO$_2$, B$_2$O$_3$, ZnO Al$_2$O$_3$, Li$_2$O, SnO$_2$, PbO | 5 | 30 | 56 | 530 |
| C7* | 0.3 | SiO$_2$, B$_2$O$_3$, ZnO Al$_2$O$_3$, Li$_2$O, SnO$_2$, PbO | 3 | 10 | 58 | 543 |

Note:
E: Example
C: Comparative example
Samples with (*) are examples out of the range of this invention.

The states of stress-cracking of the silicon particles 2 and the insulator 3, and the melting state of the insulator 3 were checked for each sample fabricated, the results of which are shown in Table 2. Subsequently, the upper surfaces of the p-type silicon particles 2 were cleaned by hydrofluoric acid aqueous solution (HF: pure water=1:100) for 2 to 5 minutes, and the appearance was evaluated for each sample, the results of which are also shown in Table 2.

Subsequently, a semiconductor layer 4 comprising a mixture of n-type crystalline silicon and amorphous silicon was formed over the silicon particles 2 and the insulator 3 to have a thickness of 300 nm, on which a silicon nitride film as a protective layer 5 was formed to have a thickness of 600 nm. A patterned electrode was formed in the region where a part of the protective layer 5 had been removed by etching so that it was connected to the semiconductor layer 4 to serve as the other electrode. Light was introduced vertically into the photoelectric conversion devices fabricated in the above described manner and the conversion efficiency was measured for each sample, the results of which are shown in Table 2.

TABLE 2

| | Melting state | Crack-ing | Bub-bling | Appearance after cleaning with HF | Conversion efficiency (%) | Overall evaluation |
|---|---|---|---|---|---|---|
| E1 | ○ | ○ | ○ | ○ | 10.5 | ○ |
| E2 | ○ | ○ | ○ | ○ | 10.6 | ○ |
| E3 | ○ | ○ | ○ | ○ | 10.6 | ○ |
| E4 | ○ | ○ | ○ | ○ | 10.7 | ○ |
| E5 | ○ | ○ | ○ | ○ | 10.8 | ○ |
| E6 | ○ | ○ | ○ | ○ | 11.0 | ○ |
| E7 | ○ | ○ | ○ | ○ | 10.4 | ○ |
| C1* | X | ○ | ○ | ○ | — | X |
| C2* | ○ | ○ | X | ○ | 4.8 | X |
| C3* | ○ | ○ | X | ○ | 5.1 | X |
| C4* | ○ | X | ○ | ○ | 5.2 | X |
| C5* | X | ○ | ○ | ○ | — | X |
| C6* | ○ | ○ | ○ | Pb deposition | — | X |

TABLE 2-continued

| | Melting state | Crack-ing | Bub-bling | Appearance after cleaning with HF | Conversion efficiency (%) | Overall evaluation |
|---|---|---|---|---|---|---|
| C7* | ○ | ○ | ○ | Pb deposition | — | X |

Note:
E: Example
C: Comparative example
Samples with (*) are examples out of the range of this invention.

In examples 1 to 5, no bubbling was observed in the interfaces of the silicon particles 2 and the insulator 3. The insulator 3 was able to fill the spaces among the silicon particles 2.

In comparative example 1, the insulator 3 did not melt at 577° C. This may be attributable to the high (22 wt %.) tin oxide content in the insulator 3.

In comparative examples 2 and 3, bubbling occurred in the interfaces between the silicon particles 2 and the insulator 3. This may be explained that due to the low content of tin oxide in the insulator 3, which was below 1 wt %, intense reaction occurred between the silicon particles 2 and the insulator 3.

In comparative example 4, the thermal expansion coefficient was $68 \times 10^{-7}$/° C. Cracking occurred in the silicon particles 2 and the insulator 3. No cracking was observed in examples 1 to 5. Judging from these results, a preferred thermal expansion coefficient is $65 \times 10^{-7}$/° C. or below.

In comparative example 5, the glass particles did not melt due to the high softening point of 577° C. In examples 1 to 5, the glass particles melted and could fill the spaces among the silicon particles 2. Judging from these results, a preferred softening point is 560° C. or below.

In comparative examples 6 and 7, PbO was added to the glass components. When cleaning was performed after the formation of the insulator 3 by using hydrofluoric acid aqueous solution {HF:pure water=1:100} for 2 to 5 minutes, abnormal deposition of metal lead on the surface of the insulator 3 was observed. Due to excessive current leakage, measurement of the conversion efficiency was impossible. On the other hand, such abnormal metal deposition was not observed in examples 1 to 5, and measurements of conversion efficiency were normally performed. Judging from these results, it is preferable not to contain lead oxide in the glass material of the insulator 3.

In examples 6 and 7, the samples were fabricated by varying the particle size of the silicon particles 2 to 0.2 mm and 0.6 mm. The obtained conversion efficiencies were similar to those of examples 1 to 4.

Accordingly, it has been verified that a good insulator capable of filling spaces among the silicon particles 2 and preventing generation of defects such as cracking, bubbling and abnormal deposition can be formed by the present invention.

<Second Embodiment (photoelectric conversion device)>

The cross sectional view of the photoelectric conversion device according to this second embodiment is the same as those shown in FIGS. 1 and 2. Accordingly, only the elements that are different from the first embodiment are described below.

An insulator 3 is made of an insulating material for separating the positive electrode from the negative electrode. It is formed by using a glass composition for low-temperature firing that is composed mainly of $SiO_2$, $B_2O_3$, ZnO and $Al_2O_3$, and contains $SnO_2$ or SnO added thereto and further contains one or more alkali metal oxides such as $Li_2O$, $Na_2O$, $K_2O$ and the like. Powder of the glass material above is formed into paste by using a solvent or binder. The paste is applied over crystalline semiconductor particles 2 deposited on a substrate 1, and then heating is carried out at a temperature below the eutectic temperature 577° C. of aluminum and silicon so as to melt the glass material, thereby forming the insulator 3.

When the heating temperature exceeds 577° C., the alloy layers 15 comprising aluminum and silicon start melting causing the joining between the substrate 1 and crystalline semiconductor particles 2 to become unstable. In some cases, due to the crystalline semiconductor particles 2 leaving the substrate 1, it is impossible to generate a photoelectric current.

The compound $SnO_2$ or SnO that is added to the glass composition for forming the insulator 3 is an essential component for suppressing reaction between silicon and $B_2O_3$—$Z_nO$ glass. In cases where $SnO_2$ or SnO is not contained, due to reaction gas resulted from a reaction between glass and silicon, bubbling occurs in the insulator 3, generating great defects and causing the problem of current leakage. Also, crystallization occurs by the heat treatment, by which formation of a transparent insulator is made impossible. That is, by adding one or both of $SnO_2$ and SnO to be contained in the glass as its essential components, the insulator can be provided with both the sealing property and transparency. In order to prevent excessive bubbling from occurring, the amount of $SnO_2$ or SnO to be added may be 1 wt % or more. However, when the content is less than 4.2 wt %, micro bubbles are generated. As a result, microcracks are generated in the insulator when subjected to a temperature cycle test. On the other hand, when the content is more than 20 wt %, since the glass transition point of the glass composition rises, it does not melt at 577° C. and fails to fill the spaces among the crystalline semiconductor particles 2. Judging from the above, the content of $SnO_2$ and/or SnO may be in the range of 4.2 to 20 wt %.

In addition, a material with a thermal expansion coefficient of $40 \times 10^{-7}$ to $80 \times 10^{-7}$/° C. at the temperature range of 40 to 400° C. is used for the insulator 3. Thermal expansion coefficients less than $40 \times 10^{-7}$/° C. are so different from the thermal expansion coefficient of the substrate 1 comprising aluminum whose thermal expansion coefficient is $240 \times 10^{-7}$/° C. that cracking occurs on the surface of the insulator 3 after the formation thereof. Thermal expansion coefficients more than $80 \times 10^{-7}$/° C. are so different from that of the crystalline semiconductor particles 2, which is, for instance, the thermal expansion coefficient of Si:$26 \times 10^{-7}$/° C., that cracking occurs in the crystalline semiconductor particles 2 and the insulator 3 around them. A more desirable range for the thermal expansion coefficient is $75 \times 10^{-7}$/° C. or less, the optimal range is $70 \times 10^{-7}$/° C. or less at the temperature range of 40 to 400° C.

In cases where the glass transition point of the glass material is higher than 515° C., the material does not melt at temperatures around 577° C., which are the temperatures for joining the substrate 1 and the crystalline semiconductor particles 2, failing to fill the spaces among the crystalline semiconductor particles 2, consequently failing to function as an insulator. The glass transition point is preferably 515° C. or below, in particular, 510° C. or below.

In this invention, it is preferable that the glass composition for the insulator 3 contains components, namely, 4.2 to 20 wt % one or both of $SnO_2$ and SnO, 25 to 55 wt % $B_2O_3$, 20 to 50 wt % ZnO, 3 to 15 wt % $Al_2O_3$, 2 to 20 wt % $SiO_2$, and 0.5 to 8 wt % alkali metal oxide, in which the weight percentage of the total amount of $B_2O_3$ and $SiO_2$ is 35 to 70 wt %, as well as the weight percentage of the total amount of all the components is 90 wt % or more.

$B_2O_3$ is a glass network former, as well as lowers the glass transition point and the thermal expansion coefficient. When the content of $B_2O_3$ is below the range of 25 to 55 wt % mentioned above, vitrification becomes hard and also it becomes hard to keep the glass transition point and thermal expansion coefficient within the above stated ranges. When the $B_2O_3$ content is above the aforementioned range, the water resistance deteriorates, which may cause the transparency to be lost after long time use. A particularly preferred range of the $B_2O_3$ content is 28 to 50 wt %, and the optimum range thereof is 30 to 45 wt %.

ZnO is a component for lowering the glass transition point and the thermal expansion coefficient. When the content of ZnO is below the range of 20 to 50 wt % stated above, the thermal expansion coefficient rises to exceed $80 \times 10^{-7}$/° C. On the other hand, when the ZnO content is above the aforementioned range, vitrification becomes hard. A more desirable range of the ZnO content is 20 to 50 wt %, and the optimum range thereof is 30 to 39.5 wt %.

$Al_2O_3$ has a function to increase the stability of glass and a function to lower the thermal expansion coefficient. When the $Al_2O_3$ content is below the range of 3 to 15 wt % stated above, not only vitrification becomes hard, but also the thermal expansion coefficient rises to exceed $80 \times 10^{-7}$/° C. When $Al_2O_3$ content is above the aforementioned range, the glass transition point becomes too high. A more desirable range of the $Al_2O_3$ content is 3.5 to 12 wt %, and the optimum range thereof is 4 to 10 wt %.

$SiO_2$ is a glass network former and functions to lower the thermal expansion coefficient. When the content of $SiO_2$ is below the range of 2 to 20 wt % stated above, vitrification becomes hard, and the thermal expansion coefficient rises to exceed $80 \times 10^{-7}/°$ C. On the other hand, when the $SiO_2$ content is above the aforementioned range, the glass transition point becomes too high. A more desirable range of the $SiO_2$ content is 3 to 17 wt %, and the optimum range thereof is 5 to 15 wt %.

Alkali metal oxides, especially at least one of $Li_2O$, $Na_2O$, $K_2O$ are components for lowering the glass transition point. When the weight percentage of the total amount of these components is below the range of 0.5 to 8 wt % stated above, it becomes very difficult to make the glass transition point 515° C. or below. In addition, these components also have a function to raise the thermal expansion coefficient and a function to facilitate crystallization of glass. When the weight percentage of the total amount of these components is above the aforementioned range, the thermal expansion coefficient becomes too high, and crystallization occurs during the heat treatment. A more desirable range of the content of the alkali metal oxides is 0.8 to 7 wt %, and the optimum range thereof is 1 to 6 wt %.

$B_2O_1$ and $SiO_2$ are glass network farmers. When the weight percentage of the total amount of these components is less than 35 wt %, vitrification becomes hard, and even if the cooling rate is increased so as to make vitrification possible, the tendency toward crystallization becomes significant. As a result, the material is crystallized in the insulating coating formation process. On the other hand, when the content is larger than 70 wt %, it becomes impossible to keep the glass transition point and thermal expansion coefficient within the above stated ranges. A more desirable range for the weight percentage of the total amount of $B_2O_3$ and $SiO_2$ is 38 to 65 wt %, and the optimum range thereof is 40 to 60 wt %.

A specific range, 90 wt % or more, is selected for the weight percentage of the total amount of all the above listed components. This is because when the content of the above components is below the aforementioned range, the desired properties cannot be obtained. A more desirable range for the weight percentage of the total amount of the above listed components is 95 wt % or more and the optimum range thereof is 97 wt % or more.

Meanwhile, arbitrary components other than the above listed components may be contained so long as the properties of the glass stay within the scope of this invention. For example, $ZrO_2$, $TiO_2$, $La_2O_3$ and the like may be contained for the purpose of enhancing chemical resistance, and MgO, CaO, SrO, BaO and the like may be contained for fine control of the thermal expansion coefficient and glass transition point at a weight percentage of 10 wt % or less, more desirably, at a weight percentage of 5 wt % or less, and optimally, at a weight percentage of 3 wt % or less.

EXAMPLE

A substrate formed by attaching a 50 μm thick aluminum alloy layer onto a stainless steel substrate by cold pressing process was used. For forming a joining-aide layer, a butyral resin was dissolved in an organic solvent and applied on the substrate by screen-printing or the doctor blade method.

On top of them, p-type silicon particles with particle sizes of 0.2 to 0.6 mm were supplied several times so that the p-type silicon particles adhered firmly enough to the joining-aide layer. Then, the substrate was tilted to remove extra p-type silicon particles. Thereafter, with the p-type silicon particles being pressed by a certain amount of load and kept still, a heat treatment was performed in the atmospheric air at a temperature above the eutectic temperature 577° C. of aluminum and silicon for 5 to 30 minutes, thereby joining the silicon particles to the aluminum alloy. In order to form an insulator 3 over the silicon particles, glass particles for low-temperature firing prepared in the form of paste, which were composed of $B_2O_3$, ZnO, $SiO_2$, $Al_2O_3$, $Li_2O$, SnO and $SnO_2$ and had average particle sizes of 0.5 to 5 μm, were applied over the silicon particles so that the glass thickness after firing was about half the particle size of the silicon particles 2. Then, a heat treatment was carried out at a temperature below the eutectic temperature 577° C. of aluminum and silicon for 5 to 30 minutes, thereby forming the insulator 3.

Through the above-mentioned process, twenty kinds of samples were fabricated by varying the components and contents thereof in the insulator 3 (Examples 11 to 21, Comparative examples 11 to 19). The number of each sample fabricated was five. In examples 11 to 21, the tin oxide ($SnO_2$ and SnO) contents in the glass were 4.2 to 20 wt %. PbO was added in comparative examples 18 and 19.

TABLE 3

| | | Example | | | | | | | | | | | | Comparative example* | | | | | | | | |
|---|---|---|---|---|---|---|---|---|---|---|---|---|---|---|---|---|---|---|---|---|---|---|
| | No. | 11 | 12 | 13 | 14 | 15 | 16 | 17 | 18 | 19 | 20 | 21 | 11 | 12 | 13 | 14 | 15 | 16 | 17 | 18 | 19 |
| Silicon particle size | mm | 0.3 | 0.3 | 0.3 | 0.3 | 0.3 | 0.3 | 0.3 | 0.3 | 0.3 | 0.2 | 0.6 | 0.3 | 0.3 | 0.3 | 0.3 | 0.3 | 0.3 | 0.3 | 0.3 | 0.3 |
| Glass composition (wt %) | $SiO_2$ | 4.2 | 0 | 3.2 | 5 | 12 | 8 | 20 | 5 | 5 | 5 | 5 | 0 | 0.5 | 1 | 4 | 22 | 4 | 5 | 5 | 5 |
| | SiO | 0 | 4.2 | 1 | 0 | 0 | 6 | 0 | 0 | 0 | 0 | 0 | 0 | 0 | 0 | 0 | 0 | 0 | 0 | 0 | 0 |
| | $SiO_2$ + SiO | 4.2 | 4.2 | 4.2 | 5 | 12 | 12 | 20 | 5 | 5 | 5 | 5 | 0 | 0.5 | 1 | 4 | 22 | 4 | 5 | 5 | 5 |
| | $B_2O_3$ | 38 | 38 | 38 | 38 | 35 | 35 | 32 | 34 | 31 | 38 | 38 | 46 | 46 | 44 | 38 | 36 | 31 | 50 | 35 | 30 |
| | ZnO | 38 | 38 | 38 | 38 | 33 | 33 | 30 | 38 | 39 | 38 | 39 | 28 | 28 | 29 | 38 | 24 | 42 | 18 | 29 | 20 |
| | $Al_2O_3$ | 5 | 5 | 5 | 5 | 4 | 4 | 4 | 7 | 7 | 5 | 5 | 7 | 7 | 7 | 5 | 4 | 7 | 6 | 9 | 4 |
| | $SiO_2$ | 11 | 11 | 11 | 11 | 12 | 12 | 10 | 10 | 10 | 11 | 11 | 15 | 15 | 15 | 11 | 10 | 7 | 12 | 10 | 7 |
| | $Li_2O$ | 3.8 | 3.8 | 3 | 4 | 4 | 4 | 8 | 8 | 3 | 3 | 4 | 3 | 5 | 4 | 4 | 4 | 8 | 5 | 2 | 4 |
| | $N_2O$ | 0 | 0 | 0 | 0 | 0 | 0 | 0 | 0 | 0 | 0 | 0 | 0 | 0 | 0 | 0 | 0 | 1 | 2 | 0 | 0 |
| | $K_2O$ | 0 | 0 | 0 | 0 | 0 | 0 | 0 | 0 | 0 | 0 | 0 | 0 | 0 | 0 | 0 | 0 | 0 | 0 | 0 | 0 |
| | $B_2O_3$ + $SiO_2$ | 49 | 49 | 49 | 49 | 47 | 47 | 42 | 44 | 41 | 49 | 49 | 61 | 61 | 58 | 49 | 46 | 38 | 62 | 45 | 37 |
| | PbO | 0 | 0 | 0 | 0 | 0 | 0 | 0 | 0 | 0 | 0 | 0 | 0 | 0 | 0 | 0 | 0 | 0 | 0 | 10 | 30 |
| Total | | 100.0 | 100.0 | 100.0 | 100.0 | 100.0 | 100.0 | 100.0 | 100.0 | 100.0 | 100.0 | 100.0 | 100.0 | 100.0 | 100.0 | 100.0 | 100.0 | 100.0 | 100.0 | 100.0 | 100.0 |
| Thermal expansion coefficient | E-7/ C | 64 | 65 | 65 | 65 | 64 | 64 | 83 | 75 | 80 | 85 | 85 | 63 | 63 | 63 | 64 | 63 | 83 | 85 | 62 | 80 |
| Glass transition point | C | 500 | 501 | 500 | 502 | 506 | 506 | 515 | 460 | 452 | 502 | 502 | 493 | 493 | 494 | 498 | 518 | 441 | 435 | 487 | 473 |
| Melting state | | ○ | ○ | ○ | ○ | ○ | ○ | ○ | ○ | ○ | ○ | ○ | ○ | ○ | ○ | ○ | X | ○ | ○ | ○ | ○ |
| Crystallization | | ○ | ○ | ○ | ○ | ○ | ○ | ○ | ○ | ○ | ○ | ○ | ○ | ○ | ○ | ○ | — | ○ | ○ | ○ | ○ |
| Cracking | | ○ | ○ | ○ | ○ | ○ | ○ | ○ | ○ | ○ | ○ | ○ | ○ | ○ | ○ | ○ | — | X | X | ○ | ○ |
| Bubbling | | ○ | ○ | ○ | ○ | ○ | ○ | ○ | ○ | ○ | ○ | ○ | X | X | ○ | ○ | — | ○ | ○ | ○ | ○ |
| Appearance after HF cleaning | | ○ | ○ | ○ | ○ | ○ | ○ | ○ | ○ | ○ | ○ | ○ | ○ | ○ | ○ | ○ | — | ○ | ○ | Pb dep. | Pb dep. |
| Cracking after 500 cycle test | | ○ | ○ | ○ | ○ | ○ | ○ | ○ | ○ | ○ | ○ | ○ | X | X | X | X | — | X | X | ○ | ○ |
| Overall evaluation | | ○ | ○ | ○ | ○ | ○ | ○ | ○ | ○ | ○ | ○ | ○ | X | X | X | X | X | X | X | X | X |

Note:
Pb dep.: Pb deposition
Samples with (*) are examples out of the range of this invention.

The states of stress-cracking in the silicon particles 2 and the insulator 3, and the melting state of the insulator 3 forming the layer were checked for each sample fabricated, the results of which are shown in Table 3. In a later step, the upper surfaces of the p-type silicon particles 2 were cleaned with hydrofluoric acid aqueous solution (HF: pure water= 1:100) for 2 to 5 minutes, and the appearance of each sample was also observed, the results of which are also shown in Table 3.

Subsequently, a semiconductor layer 4 comprising a mixture of n-type crystalline silicon and amorphous silicon was formed over the silicon particles 2 and the insulator 3 to have a thickness of 300 nm, on which a silicon nitride film as a protective layer 5 was formed to have a thickness of 600 nm. A patterned electrode was formed in the region where a part of the protective layer 5 had been removed by etching so that it was connected to the semiconductor layer 4 to serve as the other electrode. These photoelectric conversion devices were subjected to a temperature cycle test in which a temperature cycle of −40 to 90° C. was repeated 500 times. The samples were also inspected for generation of microcracks after the test, the results of which are also included in Table 3.

In comparative examples 11 and 12, significant bubbling was observed by the naked eye in the interfaces between the silicon particles 2 and the insulator 3. This may be explained that due to the low content of tin oxide ($SnO_2$ and SnO) in the glass composition, which was less than 1 wt %, intense reaction occurred between the silicon particles 2 and the insulator 3.

In comparative examples 13 and 14, no bubbling was observed by the naked eye in the interfaces between the silicon particles 2 and the insulator 3. However, microcracks were generated in the insulator after the temperature cycle test. This may be explained that although bubbling was prevented from being excessive because of the tin oxide ($SnO_2$ and SnO) content of 1 wt % or more, small reaction could not be suppressed and therefore micro bubbles were generated, from which the microcracks developed.

In comparative example 15, the insulator 3 did not melt at 577° C. This may be explained that due to the tin oxide ($SnO_2$ and SnO) content of as high as 22 wt %, the glass transition point rose to 518° C.

On the other hand, in examples 11 to 17, no bubbling was observed in the interfaces between the silicon particles 2 and insulator 3. The insulator 3 was able to fill the spaces among the silicon particles 2, and microcracks were not generated after the temperature cycle test. Good results were obtained in these examples.

According to Table 3, when the glass transition point was 515° C. or below, the glass particles melted and could fill the spaces among the silicon particles 2. Therefore, it has been found that preferred glass transition points are 515° C. or below.

In comparative examples 16 and 17, due to the thermal expansion coefficients exceeding $80 \times 10^{-7}$/° C. at temperatures 40 to 400° C., cracking occurred in the silicon particles 2 and insulator 3. On the other hand, no cracking was observed in examples 11 to 19 where the thermal expansion coefficients were $80 \times 10^{-7}$/° C. or less. Accordingly, it has been found that preferred thermal expansion coefficients are $80 \times 10^{-7}$/° C. or less.

In examples 12, 13 and 16, SnO or a mixture of $SnO_2$ and SnO were contained as the tin oxide. The obtained results were similar to those in examples 11 and 15. Accordingly, it has been found that tin oxide to be added may be at least one of SnO and $SnO_2$.

In comparative examples 18 and 19, when cleaning was performed after the formation of the insulator 3 by using hydrofluoric acid aqueous solution (HF:pure water=1:100) for 2 to 5 minutes, abnormal deposition of metal lead (Pb) on the surface of the insulator 3 was observed. Due to excessive current leakage, measurement of the conversion efficiency was impossible. On the other hand, abnormal metal deposition was not observed in examples 11 to 21, and measurements of conversion efficiency were normally performed. Judging from these results, it is preferable not to contain lead oxide (Pb) in the glass material for the insulator 3.

In examples 20 and 21, the samples were fabricated by varying the particle size of the silicon particles 2 to 0.2 mm and 0.6 mm. The obtained results were similar to those in examples 11 to 19.

Accordingly, it has been verified that a good insulator with stable reliability, which is capable of filling the spaces among the silicon particles 2 and preventing generation of defects such as cracking, bubbling and abnormal deposition can be formed by the present invention.

<Third Embodiment (glass composition for coating silicon)>

A glass composition for coating silicon according to this invention is substantially free of PbO, and contains $B_2O_3$, ZnO, and $SnO_2$ and has a thermal expansion coefficient of $80 \times 10^{-7}$/° C. or less at temperatures of 40 to 400° C. and a glass transition point of 550° C. or below.

Here, "substantially free of PbO" means that the PbO content is at a level that cannot be detected by fluorescent X-ray analyses. Namely, it is about 100 ppm or less, especially 50 ppm or less, or more strictly, 20 ppm or less.

$SnO_2$ is an essential component of $B_2O_3$—ZnO glass for suppressing reaction between silicon and glass. When $SnO_2$ is not contained, the following inconveniences arise: the resultant silicon semiconductor device is unusable; due to the gas resulted from reaction between glass and silicon, bubbling occurs during the formation of the insulating coating, generating great defects that result in an inadequate sealing property; and crystallization occurs by the heat treatment, making it impossible to form a transparent insulator. In other words, by employing $SnO_2$ to be contained in the glass as its essential component, the insulator can be provided with both the sealing property and transparency.

Meanwhile, in cases where the thermal expansion coefficient of the glass composition is larger than $80 \times 10^{-7}$/° C., the difference in thermal expansion coefficient between silicon (thermal expansion coefficient: $20 \times 10^{-7}$/° C. to $40 \times 10^{-7}$/° C.) and the glass is so great that, when such glass is used for forming an insulating coating over silicon, cracking occurs in the silicon or glass and pealing occurs in the interfaces between the glass and silicon in conjunction with the ON/OFF switching of the silicon semiconductor device or temperature changes accompanying changes in the outside environment. Furthermore, when the thermal expansion coefficient is particularly great, cracking and pealing mentioned above occur when the insulating coating is cooled after it is formed by firing, thereby making the manufacturing totally impossible. A more desirable range of the thermal expansion coefficient is $75 \times 10^{-7}$/° C. or less, and the optimum range thereof is $70 \times 10^{-7}$/° C. or less at the temperature range of 40 to 400° C.

In cases where the glass transition point of the glass material is higher than 550° C., the temperature required for firing, by which the glass material is softened and fluidized to form an insulating coating, is so high that damage to the silicon semiconductor device is extremely large making it prone to malfunction. A particularly desirable range of the glass transition point is 530° C. or below, and the optimum range thereof is 500° C. or below In this invention, it is preferable that the glass composition for coating silicon contains, namely, 1 to 20 wt % $SnO_2$, 25 to 55 wt % $B_2O_3$, 20 to 50 wt % ZnO, 3 to 15 wt % $Al_2O_3$, 2 to 20 wt % $SiO_2$ and 0.5 to 8 wt % alkali metal oxide, in which the weight percentage of the total amount of $B_2O_3$ and $SiO_2$ is 35 to 70 wt % as well as the weight percentage of the total amount of all the components is 90 wt % or more.

Here, $SnO_2$ is a component for suppressing reaction between silicon and glass as mentioned above. When the $SnO_2$ content is less than 1 wt %, the effect of suppressing reaction becomes insufficient. On the other hand, when the $SnO_2$ content is more than 20 wt %, it becomes hard to make the glass transition point below 550° C. A more desirable range of the $SnO_2$ content is 2 to 15 wt %, and the optimum range thereof is 4.2 to 10 wt %.

$B_2O_3$ is a glass network former, as well as it lowers the glass transition point and the thermal expansion coefficient. When the content of $B_2O_3$ is below the range of 25 to 55 wt % stated above, vitrification becomes hard and also it becomes hard to keep the glass transition point and thermal expansion coefficient within the above stated ranges. When the $B_2O_3$ content is above the aforementioned range, the water resistance deteriorates, which may cause transparency to he lost after long time use. A particularly preferred range of the $B_2O_3$ content is 28 to 50 wt %, and the optimum range thereof is 30 to 45 wt %.

ZnO is a component for lowering the glass transition point and the thermal expansion coefficient. When the content of ZnO is below the range of 20 to 50 wt % stated above, the thermal expansion coefficient rises to exceed $80 \times 10^{-7}/°$ C. On the other hand, when the ZnO content is above the aforementioned 20 to 50 wt % range, vitrification becomes hard. A more desirable range of the ZnO content is 20 to 50 wt %, and the optimum range thereof is 30 to 39.5 wt %.

$Al_2O_3$ has a function to increase the stability of glass and a function to lower the thermal expansion coefficient. When the $Al_2O_3$ content is below the range of 3 to 15 wt % stated above, not only vitrification becomes hard, but also the thermal expansion coefficient rises to exceed $80 \times 10^{-7}/°$ C. When the $Al_2O_3$ content is above the aforementioned 3 to 15 wt % range, the glass transition point becomes too high. A more desirable range of the $Al_2O_3$ content is 3.5 to 12 wt %, and the optimum range thereof is 4 to 10 wt %.

$SiO_2$ is a glass network former and works to lower the thermal expansion coefficient. When the content of $SiO_2$ is below the range of 2 to 20 wt % stated above, vitrification becomes hard, and the thermal expansion coefficient rises to exceed $80 \times 10^{-7}/°$ C. On the other hand, when the $SiO_2$ content is above the aforementioned 2 to 20 wt %, the glass transition point becomes too high. A more desirable range for the $SiO_2$ content is 3 to 17 wt %, and the optimum range thereof is 5 to 15 wt %.

Alkali metal oxides, especially at least one of $Li_2O$, $Na_2O$, $K_2O$ are components for lowering the glass transition point. When the weight percentage of the total amount of these components is below the range of 0.5 to 8 wt % stated above, it becomes very difficult to make the glass transition point 550° C. or below. In addition, these components also have a function to raise the thermal expansion coefficient and a function to facilitate crystallization of glass. Accordingly, when the weight percentage of the total amount of these components is above the range of 0.5 to 8 wt % stated above, the thermal expansion coefficient becomes too high, and crystallization occurs during the heat treatment. A more desirable range of the content of the alkali metal oxides is 0.8 to 7 wt %, and the optimum range thereof is 1 to 6 wt %.

$B_2O_3$ and $SiO_2$ are glass network formers. When the weight percentage of the total amount of these components is less than 35 wt %, vitrification becomes hard, and even if the cooling rate is increased so as to make vitrification possible, the tendency toward crystallization becomes significant. As a result, crystallization occurs in the insulating coating formation process. On the other hand, when it is larger than 70 wt %, it becomes impossible to keep the glass transition point and thermal expansion coefficient within the above stated ranges. A more desirable range of the weight percentage of the total amount of $B_2O_3$ and $SiO_2$ is 38 to 65 wt %, and the optimum range thereof is 40 to 60 wt %.

A specific range, 90 wt % or more, is selected for the weight percentage of the total amount of all the above listed components. This is because when the content of the above components is below the aforementioned range, the desired properties cannot be obtained. A more desirable range for the weight percentage of the total amount of the above listed components is 95 wt % or more and the optimum range thereof is 97 wt % or more.

Meanwhile, arbitrary components other than the above listed components may be contained so long as the properties of the glass stay within the scope of this invention. For example, $ZrO_2$, $TiO_2$, $La_2O_3$ and the like may be contained for the purpose of enhancing chemical resistance, CoO, NiO, $Cr_2O_3$, $Nd_2O_3$, MnO, Au, Ag, Cu and the like may be contained for coloration, and MgO, CaO, SrO, BaO and the like may be contained for fine control of the thermal expansion coefficient and glass transition point at a weight percentage of 10 wt % or less, more desirably, at a weight percentage of 5 wt % or less, or optimally, at a weight percentage of 3 wt % or less.

Also, in the present invention, it is preferred that the content of each of $As_2O_3$ and $Sb_2O_3$ which are widely used in conventional glass, especially in optical glass as clarifying agents, in the glass composition for coating silicon is 0.1 wt % or less. Most desirably, the glass composition for coating silicon does not contain $As_2O_3$ or $Sb_2O_3$ except for inevitable amount of impurities. The reason for this is that $As_2O_3$ and $Sb_2O_3$ are toxic substances which are desirably not contained in the glass composition in view of environment friendliness.

Also, in this invention, it is preferred that reaction gas is not generated when a heat treatment is carried out at 600° C. or below after the silicon is covered with the glass composition for coating silicon. This is because if some kind of reaction gas is generated by a reaction between the silicon and glass during the heat treatment for softening and fluidizing glass to form an insulating coating over the silicon, bubbles are generated in the insulating coating, creating great defects, by which the coating becomes incapable of protecting silicon and functioning as an insulator, and even loses transparency as mentioned later.

Also, it is preferred in this invention that the glass composition for coating silicon is not crystallized during the heat treatment at a temperature 600° C. or below after covering the surface of silicon. This is because if the glass material is crystallized during the heat treatment for softening and fluidizing the glass material to form an insulating coating over the silicon, a change in volume accompanying the crystallization may change the thermal expansion coefficient causing it to deviate from the desired range, and also the transparency may be lost.

In addition, it is preferred in this invention that the glass composition for coating silicon is capable of forming a substantially transparent glass coating by being subjected to a heat treatment at 600° C. or below after covering the surface of silicon. This is because if the insulating coating is not transparent after the heat treatment for softening and fluidizing the glass material to form an insulating coating, it is impossible to use such a coating especially as an insulating coating for optical sensors or solar cells.

<Fourth Embodiment (insulating coating in contact with silicon)>

Now, an insulating coating in contact with silicon according to this invention is described.

The insulating coating comprises a glass which is substantially free of PbO, and contains $B_2O_3$, ZnO and $SnO_3$, and has a thermal expansion coefficient of $80 \times 10^{-7}/°$ C. or less at temperatures of 40 to 400° C., and a glass transition point of 550° C. or below.

The insulating coating comprising glass may be fabricated by covering a surface of silicon with a glass powder which is substantially free of PbO, and contains $B_2O_2$, ZnO and $SnO_2$, and has a thermal expansion coefficient of $80 \times 10^{-7}/°$ C. or less at temperatures of 40 to 400° C. and a glass transition point of 550° C. or below, and performing a heat treatment at 600° C. or below to soften and fluidize the glass powder.

Meanwhile, when the temperature for the heat treatment is higher than 600° C., damage by heat to the silicon semiconductor device becomes so great that the rate of defective devices increases, lowering the yield and making the devices prone to malfunction. A more desirable temperature range for the heat treatment is 580° C. or below, and the optimum temperature range for it is 570° C. or below. In addition, in order to reduce damage by heat to the silicon semiconductor device, the time of the heat treatment is preferably one hour or less, more desirably, 50 minutes or less, and optimally, 45 minutes or less.

Additionally, in the present invention, it is preferred that the diameter of the largest bubble contained in the insulating coating in contact with silicon is 1 mm or less, and the number of bubbles each having a diameter of 0.1 mm or more is not more than twenty in 1 $cm^2$.

This is because when the diameter of the largest bubble is larger than 1 mm, defects in the insulating coating are so great that the sealing property for protecting the silicon semiconductor device is deteriorated and the transparency is lost. When the number of bubbles each having a diameter of 0.1 mm or more exceeds twenty in 1 $cm^2$, the insulating coating fails to have transparency.

Here, a more desirable range of the diameter of the largest bubble is 0.5 mm or less, and optimally, it is 0.2 mm or less. In addition, a more desirable range of the number of bubbles each having a diameter of 0.1 mm or more is not more than ten in 1 $cm^2$, and optimally, it is not more than five in 1 $cm^2$.

In the present invention, it is necessary that the aforementioned insulating coating in contact with silicon is substantially transparent when it is used as an insulating coating for optical sensors and solar cells. This is because if such an insulator coating is not transparent, light is not transmitted through it and the device loses its primary function.

Moreover, it is preferred in this invention that the average particle size of the aforementioned glass powder is 50 μm or less. When the average particle size of the glass powder is more than 50 μm, the fluidity of the glass powder deteriorates, the time required for the heat treatment for forming a transparent, defect-free insulating coating is therefore prolonged. As a result, damage by heat to the silicon semiconductor device becomes too great. In addition, spaces among particles in an initial stage are so large that it is difficult to fill the spaces by softening and fluidizing of the powder. A more desirable range of the average particle size is 30 μm or less, and optimally, it is 20 μm or less.

Furthermore, it is preferred in this invention that the aforementioned glass powder is a mixture of two or more different kinds of glass powders having different average particle sizes. This is because when the glass powder is supplied to the silicon surface, by mixing glass powders with two or more different particle sizes together at an appropriate ratio in which coarse powder is mixed with smaller size powder that fills spaces among the coarse powder, the powder packing density is enhanced. Shrinking of the glass during the firing can be thus suppressed to a minimum, facilitating control of the thickness and shape of the insulating coating, and improving the yield.

Figure 3:
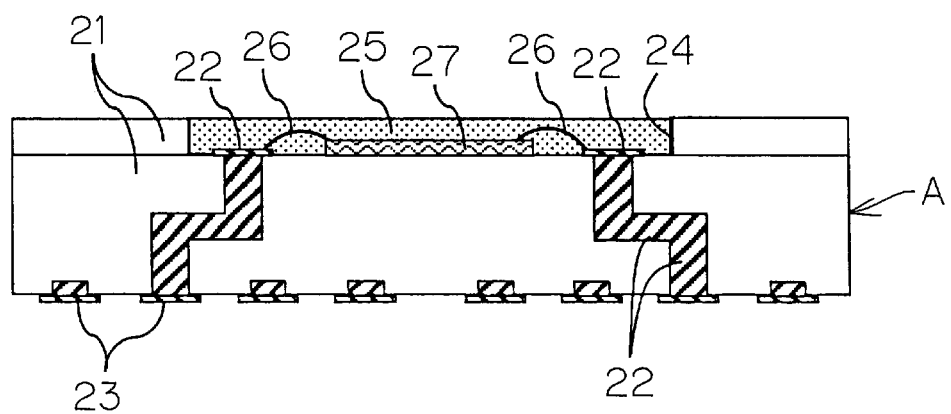
FIG. 3 shows a schematic cross-section of an optical sensor employing an insulating coating according to the present invention.
Figure 4:
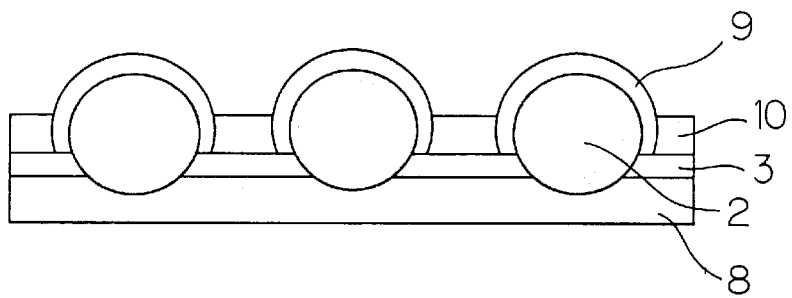
FIG. 4 is a cross-sectional view of a photoelectric conversion device according to a conventional example 1.
Figure 5:
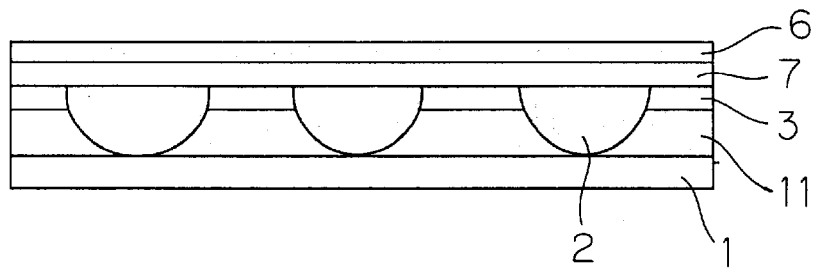
FIG. 5 is a cross-sectional view of a photoelectric conversion device according to a conventional example 2.
Figure 6:
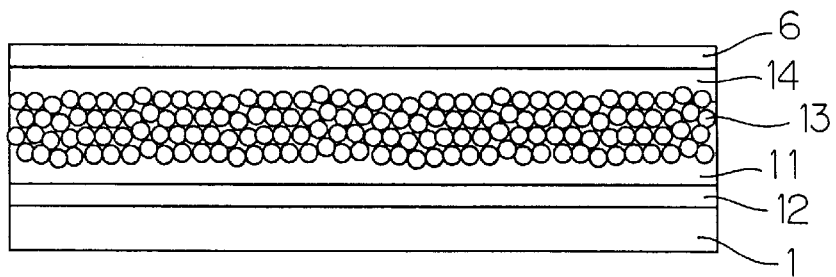
FIG. 6 is a cross-sectional view showing a photoelectric conversion device according to a conventional example 3.

As one example of products employing the insulating coating in contact with silicon described above, a preferred example, an optical sensor, is now described referring to FIG. 3 that shows a schematic cross section thereof.

In FIG. 3, there is provided a package A comprising an insulating substrate 21 made from ceramics or the like, a wiring layer 22 including metallization layers and via hole conductors, and terminal electrodes 23. A cavity 24 is formed in a central portion of the upper surface of the package A. Inside the cavity 24, a silicon optical sensor device 25 is bonded to be fixed to the insulating substrate 21 through an adhesive (not shown) made of glass or wax or the like. The silicon optical sensor device 25 is electrically connected to the wiring layer 22 through bonding wires 26 and the like. The surfaces of the silicon optical sensor 25 are sealed with an insulating coating 27.

The insulating coating 27 has a low glass transition point and a low thermal expansion coefficient, and does not react to silicon, as well as it is transparent and not crystallized in the desired temperature range. Accordingly, even when the silicon optical sensor device 25 is a large scale device, occurrence of cracking and peeling can be prevented over a long period of time, and therefore the silicon optical sensor device 25 can be sealed and protected over a long period of time.

In order to form such an insulating coating in contact with silicon as mentioned above, specifically, an appropriate organic binder, dispersant, solvent are added to the glass powder mentioned above and mixed together so as to prepare glass paste. A package on which a silicon semiconductor device has previously been mounted is prepared, and the glass paste is supplied in a required amount to the area that needs to be coated by one of the various conventionally known printing methods, a dipping process, a dispensing process, spin coating, low pressure impregnation or the like. Incidentally, it is not necessary to supply the glass paste to areas on a silicon semiconductor device, especially areas in a large scale silicon semiconductor device such as a solar cell that do not need to be coated with the insulating coating.

Subsequently, after extra solvent and the like are removed by drying, binder removal is carried out in an oxidizing atmosphere or a low oxidizing atmosphere. Thereafter, firing is carried out at a temperature of 600° C. or below in an oxidizing or non-oxidizing atmosphere to soften and fluidize the glass powder, thereby forming the insulating coating in contact with silicon of the present invention on the silicon semiconductor device.

EXAMPLE A

A prescribed amount of metal oxide powders or metal carbonate powders were used as the material. They were weighed and mixed together, and the powder mixture was melted in a platinum crucible in an atmospheric air at 1200 to 1400° C. for 2 hours. The resultant melt was rapidly cooled by pouring it onto an iron plate, thereby fabricating bulk bodies of glass having the compositions shown in Table 4.

$100 \mu m$ by a dispensing process, and dried so as to evaporate extra solvent, and thereafter subjected to a heat treatment in the atmospheric air with the conditions shown in Table 4.

The obtained insulating coatings for coating silicon formed on the silicon substrates were inspected on whether

TABLE 4

| Sample | No. | *31 | 32 | 33 | 34 | 35 | 36 | *37 | 38 | 39 | 40 | 41 | 42 | 43 | 44 | *45 | *46 |
|---|---|---|---|---|---|---|---|---|---|---|---|---|---|---|---|---|---|
| Glass composition (wt %) | $SnO_2$ | 0 | 3 | 5 | 7 | 9 | 13 | 21 | 4 | 6 | 5 | 5 | 5 | 9 | 5 | 5 | 4 |
| | $B_2O_3$ | 44 | 43 | 42 | 43 | 42 | 41 | 36 | 31 | 32 | 31 | 36 | 32 | 37 | 38 | 50 | 31 |
| | ZnO | 29 | 28 | 28 | 28 | 27 | 26 | 24 | 42 | 38 | 39 | 41 | 38 | 36 | 37 | 18 | 42 |
| | $Al_2O_3$ | 7 | 7 | 6 | 5 | 5 | 4 | 4 | 7 | 7 | 7 | 9 | 4 | 4 | 5 | 6 | 7 |
| | $SiO_2$ | 15 | 14 | 14 | 13 | 13 | 12 | 10 | 12 | 13 | 10 | 4 | 17 | 6 | 7 | 10 | 7 |
| | $Li_2O$ | 4 | 4 | 4 | 4 | 4 | 4 | 4 | 4 | 4 | 6 | 2 | 4 | 4 | 4 | 4 | 8 |
| | $Na_2O$ | 0 | 0 | 0 | 0 | 0 | 0 | 0 | 0 | 0 | 0 | 0 | 0 | 0 | 0 | 2 | 1 |
| | $K_2O$ | 0 | 0 | 0 | 0 | 0 | 0 | 0 | 0 | 0 | 0 | 0 | 0 | 1 | 1 | 2 | 0 |
| | $B_2O_3 + SiO_2$ | 59 | 57 | 56 | 56 | 55 | 53 | 46 | 43 | 45 | 41 | 40 | 49 | 43 | 45 | 60 | 38 |
| | Sub total | 99 | 99 | 99 | 100 | 100 | 100 | 99 | 100 | 100 | 98 | 97 | 100 | 97 | 97 | 97 | 100 |
| | $ZrO_2$ | 1 | 1 | 0 | 0 | 0 | 0 | 1 | 0 | 0 | 0 | 2 | 0 | 2 | 2 | 1 | 0 |
| | $TiO_2$ | 0 | 0 | 1 | 0 | 0 | 0 | 0 | 0 | 0 | 0 | 0 | 0 | 0 | 0 | 2 | 0 |
| | CoO | 0 | 0 | 0 | 0 | 0 | 0 | 0 | 0 | 0 | 2 | 0 | 0 | 1 | 0 | 0 | 0 |
| | $Nd_2O_3$ | 0 | 0 | 0 | 0 | 0 | 0 | 0 | 0 | 0 | 0 | 1 | 0 | 0 | 1 | 0 | 0 |
| | Total | 100 | 100 | 100 | 100 | 100 | 100 | 100 | 100 | 100 | 100 | 100 | 100 | 100 | 100 | 100 | 100 |
| Vitrification | | ○ | ○ | ○ | ○ | ○ | ○ | ○ | ○ | ○ | ○ | ○ | ○ | ○ | ○ | ○ | ○ |
| Thermal expansion coefficient | E-7/° C. | 63 | 64 | 64 | 66 | 66 | 65 | 63 | 64 | 62 | 72 | 60 | 66 | 68 | 69 | 85 | 83 |
| Glass transition point | ° C. | 480 | 482 | 485 | 489 | 499 | 527 | 554 | 488 | 485 | 459 | 515 | 501 | 495 | 488 | 432 | 441 |
| HT temperature | °C. | 550 | 550 | 550 | 560 | 570 | 590 | 610 | 560 | 570 | 530 | 580 | 580 | 570 | 570 | 510 | 510 |
| HT time | Min. | 15 | 15 | 15 | 15 | 15 | 15 | 30 | 15 | 15 | 15 | 30 | 15 | 15 | 15 | 15 | 15 |
| Crystallization | | ○ | ○ | ○ | ○ | ○ | ○ | ○ | ○ | ○ | ○ | ○ | ○ | ○ | ○ | ○ | ○ |
| Diameter of largest bubble | mmm | 15 | 0.5 | 0.4 | 0.4 | 0.3 | 0.3 | 0.3 | 0.3 | 0.4 | 0.5 | 0.4 | 0.8 | 0.3 | 0.6 | 0.5 | 0.6 |
| Number of bubbles | $N/cm^2$ | 42 | 10 | 7 | 5 | 4 | 2 | 1 | 6 | 6 | 6 | 5 | 9 | 5 | 9 | 8 | 7 |
| Transparency | Initial stage | X | ○ | ○ | ○ | ○ | ○ | ○ | ○ | ○ | ○ | ○ | ○ | ○ | ○ | X | ○ |
| | After 500 cycle test | — | ○ | ○ | ○ | ○ | ○ | ○ | ○ | ○ | ○ | ○ | ○ | ○ | ○ | — | X |

Note:
HT: Heat treatment
Samples with (*) are examples out of the range of this invention.

Each of the bulk bodies of glass was processed into a prismatic shape of 4×4×15 mm in size, and the thermal expansion coefficient at temperatures 40 to 400° C. was measured by using a thermomechanical analyzer for each sample. The obtained results are shown in Table 4.

Subsequently, the glass was crushed in a ball mill so that the particles have average particle sizes of 5 $\mu m$ and 0.5 $\mu m$. At this stage, the glass transition point of the powder with an average particle size of 5 $\mu m$ was measured with a differential scanning calorimeter (DSC) and furthermore, vitrification was checked by using an x-ray diffraction analyzer, where samples that did not show crystalline diffraction patterns were marked by ○ (good), samples that showed crystalline diffraction patterns were marked by x (defective), the results of which are shown in Table 4.

Then, the two kinds of glass powders having different average particle sizes were weighed so that the weight ratio between them was "5 $\mu m$ average particle size glass/0.5 $\mu m$ average particle size glass=70/30", and an organic binder, a dispersant and a solvent were added to the mixture and mixed together to prepare glass paste.

Meanwhile, polycrystalline silicon substrates used for solar cells and the like were prepared for evaluation purpose, which had been previously cut into 1 cm pieces.

Then, the aforementioned glass paste was applied to each of the silicon substrates for evaluation to have a thickness of they had crystalline phases or not by an x-ray diffraction analysis, where samples that did not show crystalline diffraction patterns were marked by ○ (good), and samples that showed crystalline diffraction patterns were marked by x (defective) The obtained results are shown in Table 4. Also, photographs of the insulating coatings were taken with a CCD camera, and the diameter of the largest bubble and the number of bubbles each having a diameter larger than 0.1 mm in 1 $cm^2$ area were measured for each sample, the results of which are shown in Table 4. Here, samples in which the diameter of the largest bubble was larger than 1 mm and samples in which the number of bubbles with diameters of 0.1 mm or more was more than 20 in 1 $cm^2$ area were evaluated as defective.

Also, in an evaluation of transparency by the naked eye, samples in which the grain boundaries of the polycrystalline silicon substrates were viewable through the insulating coatings were marked by ○ (good), while samples in which they were not viewable were marked by x (defective).

Furthermore, a temperature cycle test was carried out, in which the insulating coatings formed on the silicon substrates for evaluation were disposed alternately in thermostatic ovens whose temperatures were kept at 0° C. and 80° C. in the ambient atmosphere, and the samples were kept in each of the ovens for 15 minutes, which was determined as one cycle. Five hundred cycles were performed in the temperature cycle test. After the test, the silicon substrates and/or insulating coatings were inspected on the presence or absence of cracking and peeling. Samples in which no cracking or peeling occurred were marked by ○ (good), and samples in which cracking or peeling occurred were marked by X (defective).

As is apparent from the results shown in Table 4, in samples No. 32 to 36, 38 to 44 based upon the present invention had thermal expansion coefficients of less than $80 \times 10^{-7}/°$ C. at the temperature range of 40 to 400° C., and glass transition points of less than 500° C. They did not emit gas due to reaction to silicon, and were not crystallized, resulting in transparent insulating coatings. In addition, they did not suffer cracking or peeling even after the temperature cycle test, good insulating coatings were therefore formed on the surfaces of the silicon.

On the other hand, in sample No. 31 which did not contain $SnO_2$, glass and silicon reacted to each other generating many large bubbles. As a result, a transparent insulating coating was not formed in sample 31. In sample No. 37 where the $SnO_2$ content was larger than 20 wt %, the glass transition point was higher than 550° C. As a result, formation of an insulating coating was impossible by the heat treatment at a temperature below 600° C. In addition, in samples No. 45, 46 in which the thermal expansion coefficients were larger than $80 \times 10^{-7}/°$ C., cracking and peeling occurred after the 500 cycle-temperature cycle test. The samples were of the quality that is incapable of securing long time reliability.

EXAMPLE B

An optical sensor apparatus with a silicon optical sensor device mounted on an alumina package was prepared. Glass paste was formed by using the glass powder in sample No. 33 shown in Table 4 in the same way as in Example A, and an insulating coating was formed on the optical sensor device by the same process.

When the operation of the optical sensor apparatus was examined, it exhibited good properties of sensor. Also, its performance did not change after the 500 cycle-temperature cycle test similar to the above mentioned one.

What is claimed:

1. A photoelectric conversion device comprising: a metal substrate or a substrate having a metal layer formed on a surface thereof;
   numerous first conductivity-type crystalline semiconductor particles deposited on the substrate;
   an insulator provided among the numerous first conductivity-type crystalline semiconductor particles; and
   a second conductivity-type semiconductor region formed on upper portions of the first conductivity-type crystalline semiconductor particles,
   wherein the crystalline semiconductor particles comprise silicon, and tho insulator comprises a glass material which contains at least 1 wt % and at most 20 wt % tin oxide.

2. The photoelectric conversion device according to claim 1, wherein the insulator has a thermal expansion coefficient of $30 \times 10^{-7}/°$ C. to $65 \times 10^{-7}/°$ C. at temperatures of 30 to 300° C.

3. The photoelectric conversion device according to claim 1, wherein the insulator has a glass transition point of 560° C. or below.

4. The photoelectric conversion device according to claim 1, wherein the metal of the metal substrate or the metal layer comprises aluminum.

5. The photoelectric conversion device according to claim 1, wherein the crystalline semiconductor particles have an average particle size of 0.2 mm to 0.6 mm.

6. The photoelectric conversion device according to claim 1, wherein the insulator is substantially free of lead oxide.

7. The photoelectric conversion device according to claim 1, wherein the insulator has a thermal expansion coefficient of $40 \times 10^{-7}/°$ C. to $80 \times 10^{-7}/°$ C. at temperatures of 40 to 400° C.

8. The photoelectric conversion device according to claim 1, wherein the insulator has a glass transition point of 515° C. or below.

9. The photoelectric conversion device according to claim 1, wherein the insulator comprises a glass composition which contains 4.2 to 20 wt % at least one of SnO and $SnO_2$, 25 to 55 wt % $B_2O_3$, 20 to 50 wt % ZnO, 3 to 15 wt % $Al_2O_3$, 2 to 20 wt % $SiO_2$, and 0.5 to 8 wt % alkali metal oxide, in which the weight percentage of the total amount of $B_2O_3$ and $SiO_2$ is 35 to 70 wt %, and the weight percentage of the total amount of all the components is 90 wt % or more.

10. The photoelectric conversion device according to claim 1, wherein the metal of the metal substrate or the metal layer comprises aluminum.

11. The photoelectric conversion device according to claim 1, wherein the crystalline semiconductor particles have an average particle size of 0.2 mm to 0.6 mm.

* * * * *